(12) United States Patent
Choi et al.

(10) Patent No.: US 9,171,901 B2
(45) Date of Patent: Oct. 27, 2015

(54) METHOD FOR IMPROVING DEVICE PERFORMANCE USING DUAL STRESS LINER BOUNDARY

(71) Applicant: Texas Instruments Incorporated, Dallas, TX (US)

(72) Inventors: Youn Sung Choi, Plano, TX (US); Greg Charles Baldwin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/478,144

(22) Filed: Sep. 5, 2014

(65) Prior Publication Data

US 2014/0374836 A1    Dec. 25, 2014

Related U.S. Application Data

(62) Division of application No. 13/288,664, filed on Nov. 3, 2011, now Pat. No. 8,859,357.

(60) Provisional application No. 61/409,583, filed on Nov. 3, 2010.

(51) Int. Cl.

| | |
|---|---|
| *H01L 21/00* | (2006.01) |
| *H01L 29/06* | (2006.01) |
| *H01L 21/8238* | (2006.01) |
| *H01L 27/02* | (2006.01) |
| *H01L 29/78* | (2006.01) |
| *H01L 27/092* | (2006.01) |
| *H01L 29/10* | (2006.01) |

(52) U.S. Cl.
CPC .... *H01L 29/0638* (2013.01); *H01L 21/823807* (2013.01); *H01L 27/0203* (2013.01); *H01L 27/092* (2013.01); *H01L 29/1033* (2013.01); *H01L 29/7843* (2013.01)

(58) Field of Classification Search
CPC ............ H01L 29/0638; H01L 29/1033; H01L 27/092; H01L 21/823807; H01L 29/7843; H01L 27/0203
See application file for complete search history.

(56) References Cited

U.S. PATENT DOCUMENTS

| | | | |
|---|---|---|---|
| 8,859,357 B2 * | 10/2014 | Choi et al. .................... | 438/199 |
| 2007/0108526 A1 * | 5/2007 | Kohyama ...................... | 257/351 |
| 2012/0117519 A1 | 5/2012 | Parikh | |
| 2012/0119301 A1 | 5/2012 | Choi et al. | |

\* cited by examiner

*Primary Examiner* — Laura Menz

(74) *Attorney, Agent, or Firm* — Tuenlap D. Chan; Frank D. Cimino

(57) ABSTRACT

An integrated circuit with DSL borders perpendicular to the transistor gates primarily inside the nwell and with DSL borders parallel to the transistor gates primarily outside the nwell. A method for forming an integrated circuit with DSL borders perpendicular to the tranistor gates primarily inside the nwell and with DSL borders parallel to the transistor gates primarily outside the nwell.

6 Claims, 5 Drawing Sheets

METHOD FOR IMPROVING DEVICE PERFORMANCE USING DUAL STRESS LINER BOUNDARY

This application is a divisional of U.S. Nonprovisional patent application Ser. No. 13/288,664, filed Nov. 3, 2011, and claims the benefit of U.S. provisional application Ser. No. 61/409,583, filed Nov. 3, 2010, the contents of which are herein incorporated by reference in its entirety.

FIELD OF THE INVENTION

This invention relates to the field of integrated circuits. More particularly, this invention relates to dual stress liners in integrated circuits

BACKGROUND OF THE INVENTION

As technology scales, transistor performance is not improving accordingly. In order to increase transistor performance, various processes have been implemented to apply stress to the channel region to enhance carrier mobility. Compressive stress enhances hole mobility when applied parallel to the current flow in a PMOS transistor. One method to apply compressive stress in PMOS transistors is to remove silicon from the source and drain regions and replace it with epitaxially grown silicon germanium (SiGe). Germanium is a larger atom than silicon so the lattice constant of crystalline SiGe is greater than crystalline Si applying compressive stress to the PMOS channel region. Another method is to deposit a compressive contact etch stop layer over the PMOS transistors.

For NMOS transistors, applying tensile stress either perpendicular or parallel to the current flow enhances electron mobility. One method of applying tensile stress to the channel region in an NMOS transistor is to deposit a tensile contact etch stop layer over the NMOS transistor.

Dual stress liner (DSL) technology has been developed to deposit a compressive contact etch stop layer over the PMOS to enhance hole mobility and to deposit a tensile contact etch stop layer over the NMOS to enhance electron mobility. The compressive and tensile etch stop layers are typically formed using a PECVD silicon nitride film 20 nm to 50 nm thick. Deposition conditions may be varied to deposit either a highly compressive or a highly tensile stress silicon nitride film. Typically a compressive contact etch stop layer is deposited over the entire wafer and then patterned and etched away from the NMOS transistor regions followed by a tensile contact etch stop layer deposited over the entire wafer and then patterned and etched away from the PMOS transistor regions.

A boundary is formed where the borders of the compressive and tensile etch stop layers meet (DSL border). Typically an overlap region is formed at the border where a strip of tensile contact etch stop layer overlies the border of the compressive contact etch stop layer. The spacing of this DSL border from the PMOS active area perpendicular to the PMOS transistor gate may be adjusted to improve PMOS transistor characteristics.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit with the placement of DSL borders to optimize performance of the PMOS and the NMOS transistors. An integrated circuit with DSL borders perpendicular to the transistor gates primarily inside the nwell and with DSL borders parallel to the transistor gates primarily outside the nwell. A method for forming an integrated circuit with DSL borders perpendicular to the transistor gates primarily inside the nwell and with DSL borders parallel to the transistor gates primarily outside the nwell.

DETAILED DESCRIPTION OF EMBODIMENTS

Figure 1:
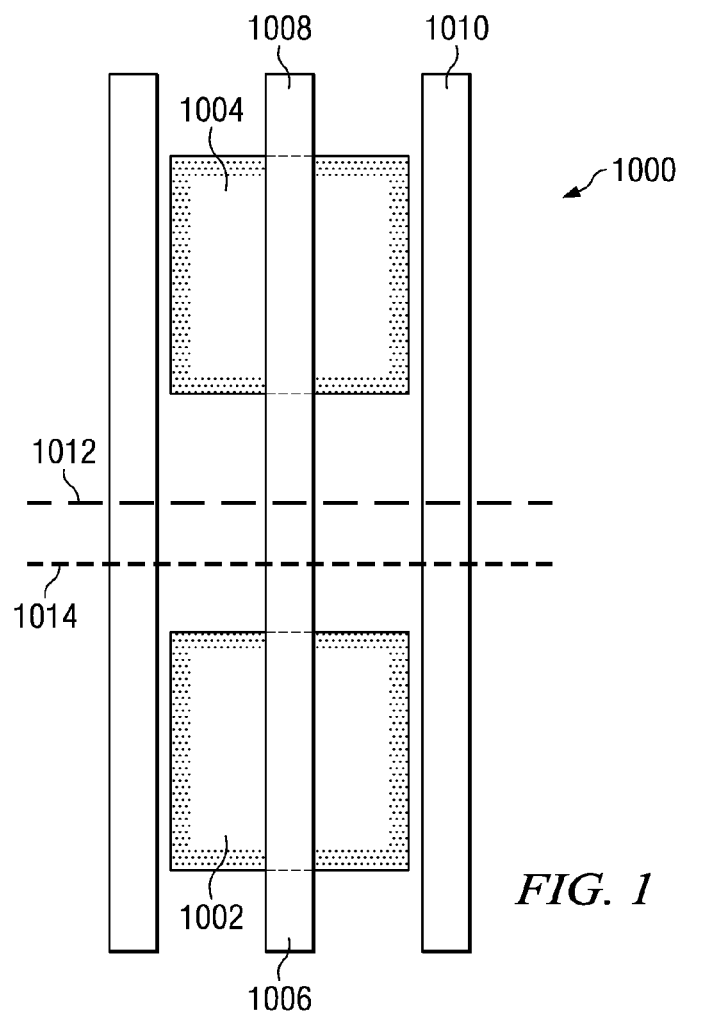
FIG. 1 is a top down view of the placement of a DSL border between vertically placed NMOS and PMOS transistors according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Dual stress liner (DSL) technology has been developed to deposit a compressive contact etch stop layer over the PMOS to enhance hole mobility and to deposit a tensile contact etch stop layer over the NMOS to enhance electron mobility. The compressive and tensile etch stop layers are typically formed using a PECVD silicon nitride film 20 nm to 50 nm thick. Deposition conditions may be varied to deposit either a highly compressive or a highly tensile stress silicon nitride film. Typically a compressive contact etch stop layer is deposited over the entire wafer and patterned and etched away from the NMOS transistor regions followed by deposition of a tensile contact etch stop layer over the entire wafer which is then patterned and etched away from the PMOS transistor regions.

A boundary is formed where the borders of the compressive and tensile etch stop layers meet (DSL border). Typically an overlap region is formed at the DSL border where a strip of tensile contact etch stop layer overlies the border of the compressive contact etch stop layer. (In some process flows, the tensile etch stop layer may be deposited first in which case a strip of compressive contact etch stop layer would overlie the border of the tensile contact etch stop layer.) The distance of the DSL border from the PMOS active area perpendicular to the PMOS transistor gate has been found to change PMOS transistor characteristics. While hole mobility is enhanced by compressive stress applied parallel to the current flow, hole mobility is retarded by compressive stress and enhanced by tensile stress applied perpendicular to the current flow. Moving the DSL border that is perpendicular to the PMOS gate closer to the PMOS active area may enhance hole mobility by reducing the compressive stress applied perpendicular to the current flow.

Experimental data shows that moving the DSL border closer to the p-active of the PMOS transistor increases PMOS drive current until the spacing of the DSL border to the p-active reaches approximately 100 nm. As the spacing gets smaller the PMOS drive current decreases. Experimental data also shows that the drive current of an adjacent NMOS transistor may be improved by moving the DSL border away from the n-active.

Adjacent vertically spaced NMOS and PMOS transistors are shown in FIG. 1. The nwell boundary 1012 lies approximately midway between the p-active region 1002 and n-active region 1004. The gates of the PMOS transistor 1006 and the NMOS transistor 1008 are connected as in an inverter. Dummy gates 1010 are typically present to assist photolithography and gate etch uniformity. Typically the DSL border 1014 is formed at the well boundary, but data shows the PMOS and NMOS transistor performance may be improved by moving the DSL border 1014 closer to the p-active region 1002. According to an embodiment the DSL border 1014 is placed approximately half way between the well boundary 1012 and the p-active region 1002 in FIG. 1.

TABLE 1 and TABLE 2 show the percent drive current gain of PMOS and NMOS transistors as a function of the distance of the DSL border 1014 from the p-active region 1002 and n-active region 1004 areas. In TABLE 1 as the DSL border gets closer to the p-active region, the percent current gain increases to a maximum of 8% at about 100 nm and then drops off to 3% at 50 nm. TABLE 2 shows that the NMOS transistor drive current is degraded by proximity of the DSL border. As the distance of the DSL border 1014 from the n-active region increases from 50 nm to 500 nm degradation to the NMOS transistor decreases from −12% to −6.4%. This data indicates it may be desirable to place the DSL border that is perpendicular to the gate closer to the p-active region than the n-active region. In a preferred embodiment the DSL border which is perpendicular to the gate is placed inside the nwell. In another preferred embodiment DSL border which is perpendicular to the gate is placed approximately 100 nm from the p-active region.

Figure 2:
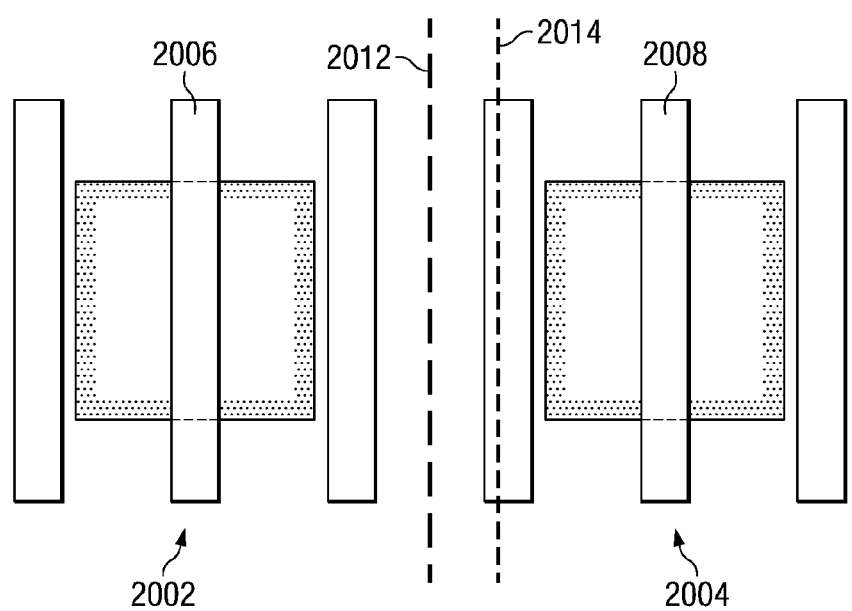
FIG. 2 is a top down view of the placement of a DSL border between laterally placed NMOS and PMOS transistors according to an embodiment.

FIG. 2 shows PMOS 2002 and NMOS 2004 transistors with vertical gates, 2006 and 2008, placed horizontally next to each other with an nwell boundary 2012 placed approximately midway between the n-active region 2004 and the p-active region 2002. Data show that placement of the DSL border 2014 impacts the performance of both the PMOS and NMOS transistors. According to an embodiment the DSL border 2014 is placed approximately half way between the well boundary 2012 and the n-active region 2004.

TABLE 1

PMOS

| DSL border to P-active space perpendicular to gate | percent drive current gain |
|---|---|
| 50 nm | 3 |
| 100 nm | 8 |
| 150 nm | 7 |
| 200 nm | 6 |
| 250 nm | 5 |
| 300 nm | 4 |
| 350 nm | 3 |
| 400 nm | 2.5 |
| 450 nm | 2 |
| 500 nm | 1.5 |
| 5000 nm | 0 |

TABLE 2

NMOS

| DSL border to N-active space perpendicular to gate | percent drive current gain |
|---|---|
| 50 nm | −12 |
| 100 nm | −11 |
| 150 nm | −10 |
| 200 nm | −9.2 |
| 250 nm | −8.6 |
| 300 nm | −8.2 |
| 350 nm | −7.6 |
| 400 nm | −7.2 |
| 450 nm | −6.8 |
| 500 nm | −6.4 |
| >5000 nm | 0 |

TABLE 3

PMOS

| DSL border to P-active space parallel to gate | percent drive current gain |
|---|---|
| 50 nm | −35 |
| 100 nm | −33 |
| 150 nm | −23 |
| 200 nm | −15 |
| 250 nm | −12.5 |
| 300 nm | −11 |
| 350 nm | −10 |
| 400 nm | −9 |
| 450 nm | −8 |
| 500 nm | −7 |
| >5000 nm | 0 |

TABLE 4

NMOS

| DSL border to N-active space parallel to gate | percent drive current gain |
|---|---|
| 50 nm | −5 |
| 100 nm | −4 |
| 150 nm | −3.75 |
| 200 nm | −3.5 |
| 250 nm | −3.25 |
| 300 nm | −3 |
| 350 nm | −2.75 |
| 400 nm | −2.5 |
| 450 nm | −2.25 |
| 500 nm | −2 |
| >5000 nm | 0 |

TABLES 3 and 4 show the percentage change in PMOS and NMOS transistor drive current as a function of the distance that the DSL border parallel to the gate is to the p-active region 2002 and n-active region 2004. It can be seen in TABLE 3 that the PMOS drive current is severely degraded as the DSL border gets closer to the p-active region 2002.

TABLE 4 shows the drive current of the NMOS transistor is less sensitive to changes in the proximity of the DSL border. As is evident from this data it may be desirable to place the DSL border that is parallel to the gate closer to the n-active region than the p-active region. In a preferred embodiment the DSL border parallel to the gate is placed outside the nwell. In another preferred embodiment the DSL border parallel to the gate 2014 is placed approximately half the distance between the nwell 2012 and the n-active region 2004.

The term "Perpendicular DSL border" refers to a DSL border which is perpendicular to a transistor gate.

The term "Parallel DSL border" refers to a DSL border which is parallel to a transistor gate.

Figure 3A:
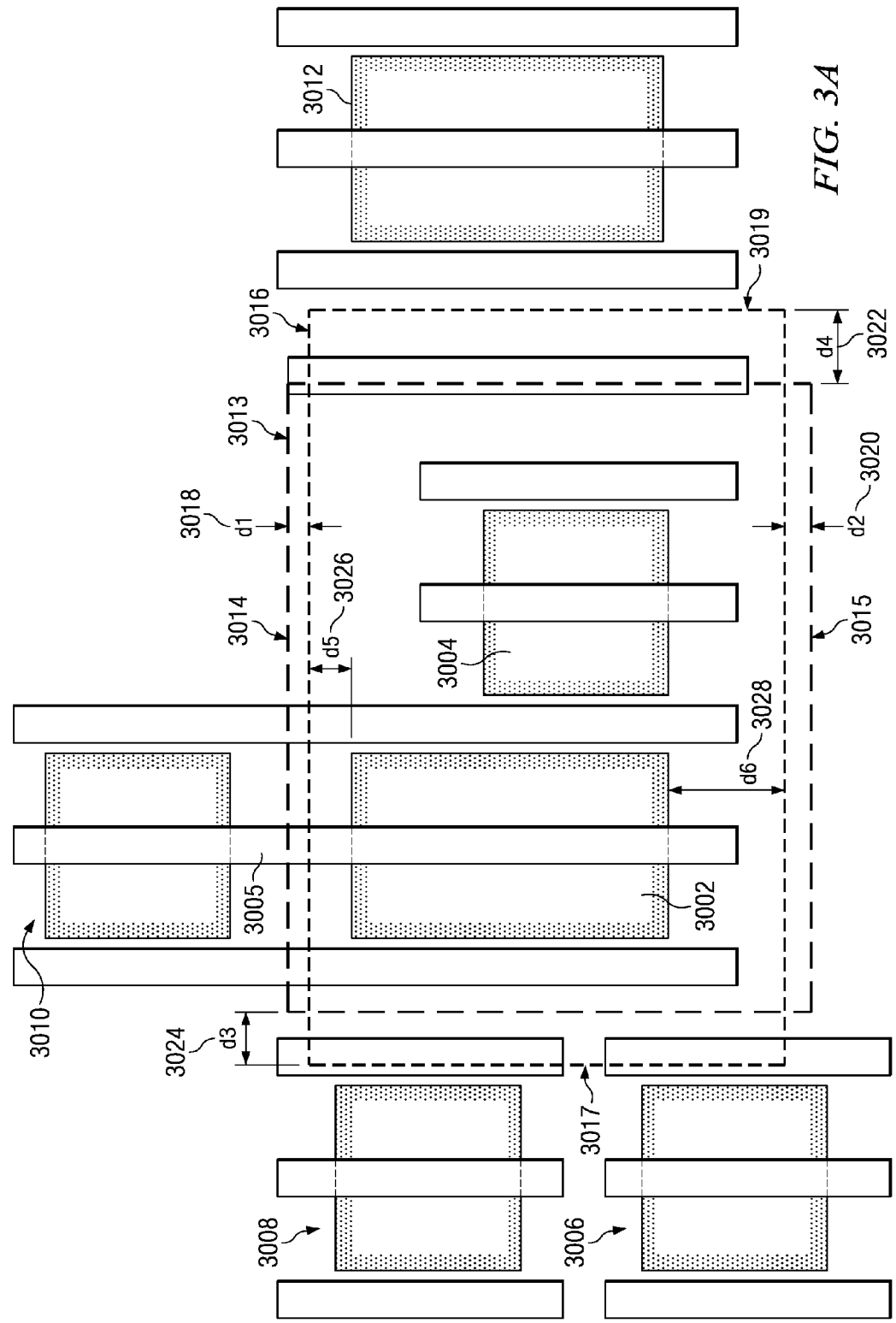
FIGS. 3 A and 3B are top down illustrations of a DSL border to nwell space design rule according to embodiments.

FIG. 3A illustrates embodiment DSL to nwell space design rules for placement of the DSL border 3016 with respect to a simple geometry nwell boundary 3014. The example circuit contains large and small PMOS transistors, 3002 and 3004, within an nwell 3014. The nwell boundary 3014 lies between the PMOS transistors, 3002 and 3004 and NMOS transistors 3006, 3008, 3010, and 3012. In this embodiment the perpendicular DSL borders 3013 and 3015 are placed a distance d1 3018 and d2 3020 inside the nwell boundary 3014. Preferrably the distances d5 3026 and d6 3028 may be approximately 100 nm. In an embodiment, the perpendicular DSL border is inside the nwell. In a preferred embodiment, the perpendicular DSL border may be placed approximately half the distance between the nwell boundary 3014 and the p-active region 3002. The distances d1 3018 and d2 3020 may be defined by an perpendicular DSL border to nwell space design rule in which case d1 and d2 may be the same.

Parallel DSL borders, 3017 and 3019, are placed a distance d3 3024 and d4 3022 outside the nwell boundary 3014. The distances d3 3024 and d4 3022 may be approximately half the distance between the nwell boundary 3014 and the n-active region of transistors 3008 and 3012. In an embodiment, the parallel DSL border lying is placed outside the nwell. In a preferred embodiment, the parallel DSL border may be placed approximately half the distance between the nwell boundary 3014 and the n-active region 3008 and 3012. Distances d3 3024 and d4 3022 may be defined by a parallel DSL border to nwell space design rule in which case d3 and d4 may be equal.

Figure 3B:
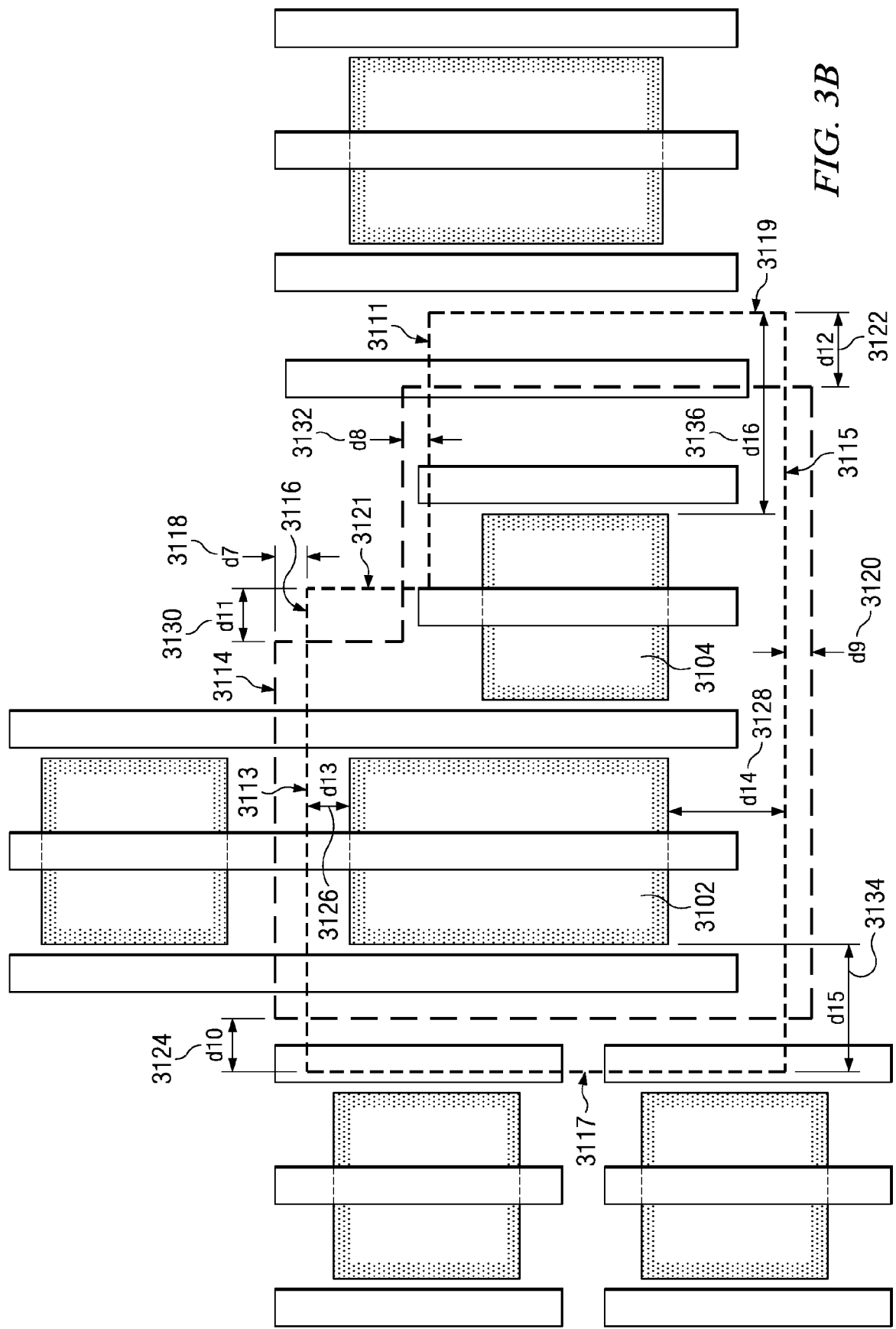

FIG. 3B illustrates the same embodiment rules for placement of the DSL border 3116 with respect to a more complex nwell geometry 3114. In this embodiment the placement of the parallel DSL border 3121 (space d11, 3130) takes precedence over the placement of the perpendicular DSL border 3111 (space d8, 3132) because the parallel stress effects in TABLE 3 are significantly larger than the perpendicular stress effects in TABLE 1. A perpendicular DSL border to nwell space design rule may specify spaces d7 3118, d8 3132, and d9 3120 in which case these distances may be the same. Likewise a parallel DSL border to nwell space design rule may specify spaces d10 3124, d11 3130, and d12 3122 in which case these distances may be equal. In a preferred embodiment the major portion of the perpendicular DSL boundary lies within the nwell and the major portion of the parallel DSL boundary lies outside the nwell. In another preferred embodiment the distance of the perpendicular DSL boundary to p-active region d13 3126 and d14 3128 is approximately 100 nm and the distance of the parallel DSL boundary to p-active region, d15 3134 and d16 3136 is greater than approximately 200 nm.

Figure 4A:
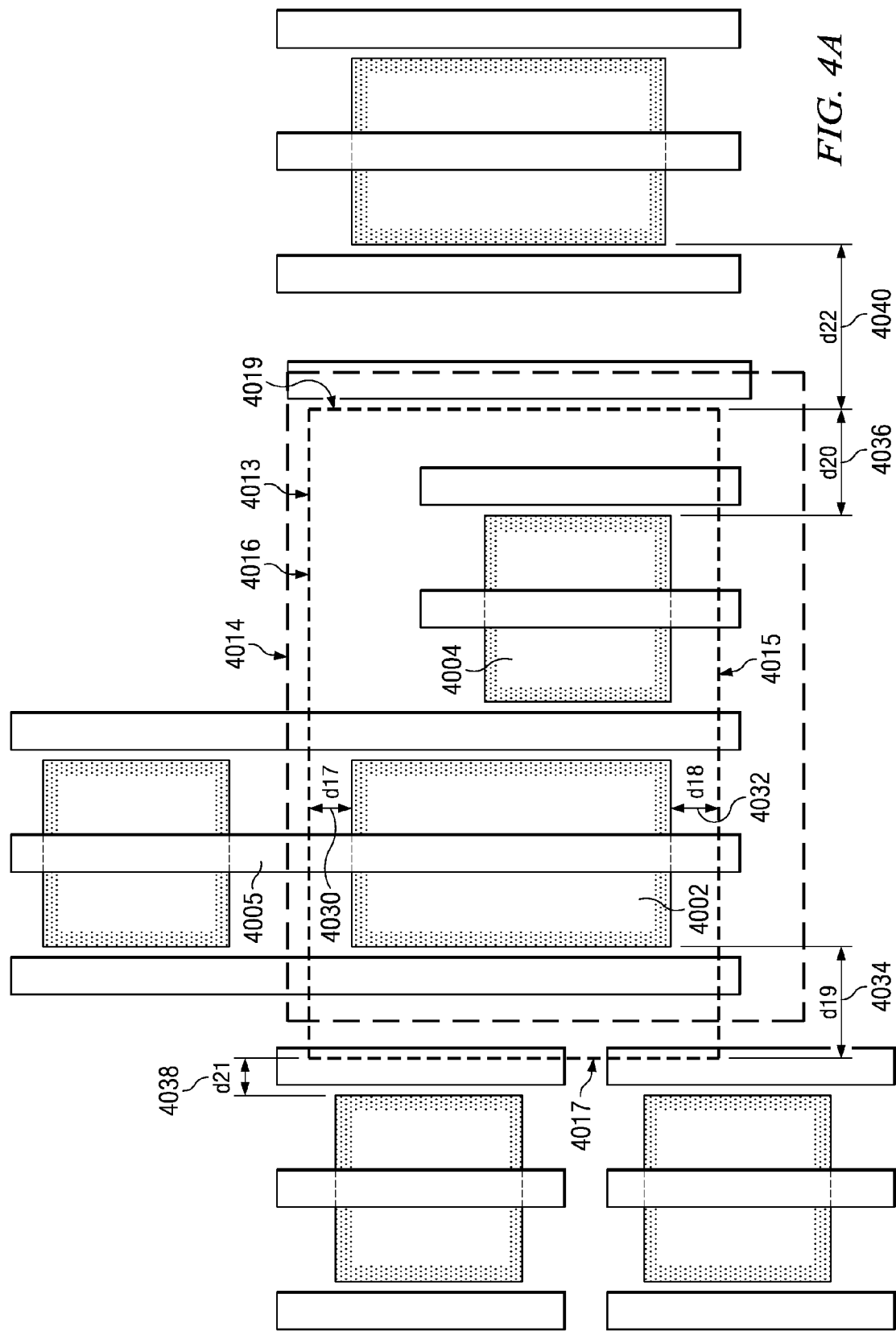
FIGS. 4 A and 4B are top down illustrations of a DSL border to p-active space design rule according to embodiments.

FIG. 4A illustrates another embodiment design rule method for forming a simple geometry DSL border 4016 with respect to p-active regions 4002 and 4004. In this case the design rules are parallel and perpendicular DSL boundary to p-active space design rules. In this embodiment the perpendicular DSL borders 4013 and 4015, are placed at distances d17 4030 and d18 4032 from the largest p-active area 4002 in the nwell 4014. For ease in manufacturing, a simple geometry large enough to encompass all the p-active areas 4002 and 4004 may be drawn. A perpendicular DSL border to p-active space design rule may specify distances d17 4030 and d18 4032 in which case d17 and d18 spaces may be equal.

Likewise parallel DSL borders 4017 and 4019 are placed distances d19 4034 and d20 away from the outermost p-active areas that are in the nwell 4014. A parallel DSL border to p-active space design rule may specify distances d19 4034 and d20 4036 in which case d19 and d20 may be equal spaces. Alternatively a parallel DSL border to n-active space design rule may specify distances d21 4038 and d22 4040 in which case d21 and d22 may be equal. In a preferred embodiment, a parallel DSL border to n-active space design rule may be defined to move the parallel DSL border as far from the p-active region as possible. For example, if the n+ to p+ spacing (d20+d22) is less than 200 nm, d22 4040 may be set to 50 nm and if the n+ to p+ spacing (d20+d22) is greater than 200 nm, d22 4040 may be set to 100 nm.

Figure 4B:
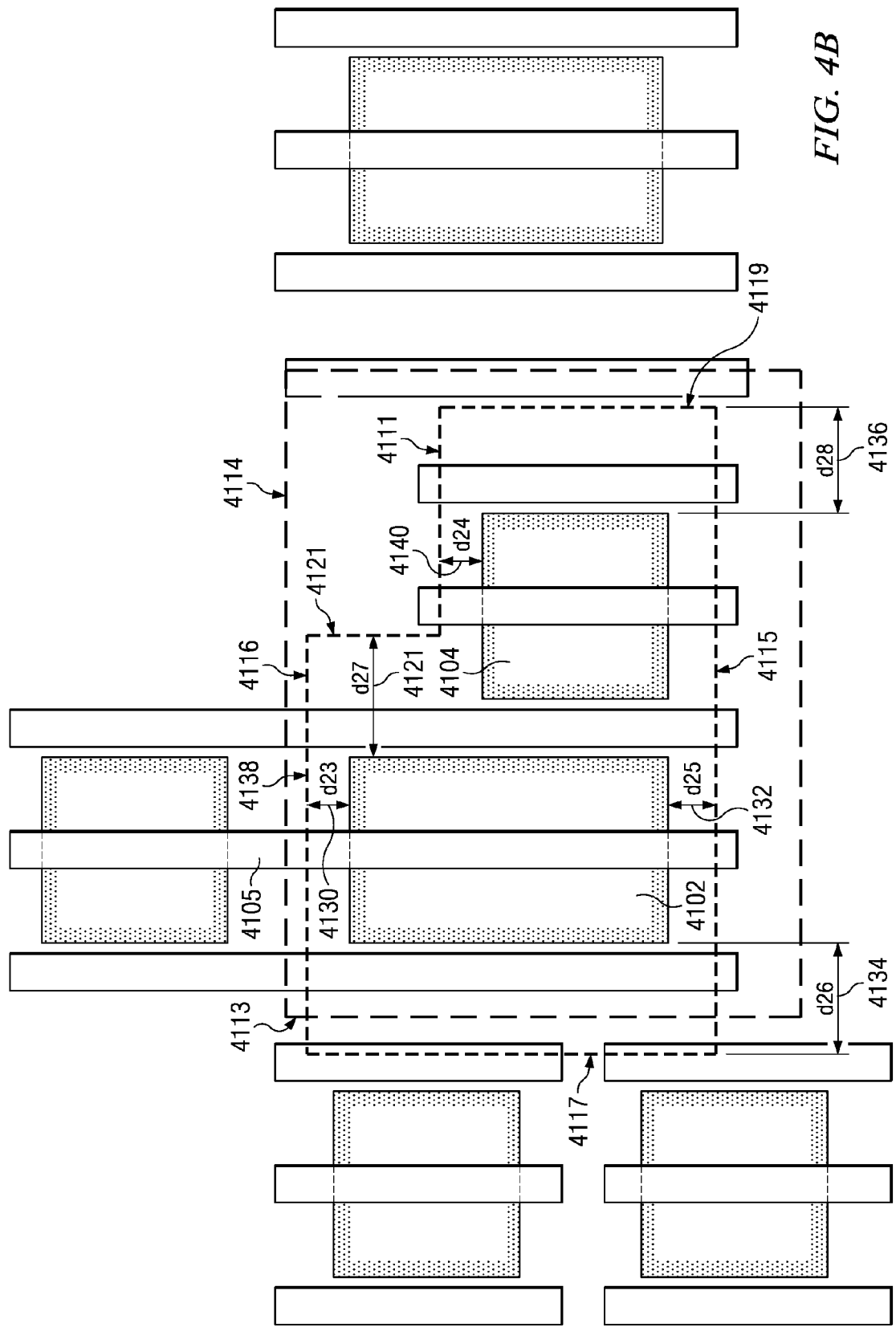

FIG. 4B illustrates an embodiment design rule method of forming a DSL border 4116 with respect to p-active regions 4102 and 4104. In this embodiment, perpendicular DSL borders 4111, 4113, and 4115 may be spaced at distances d23 4130, d24 4140, and d25 4132 from p-active areas 4102 and 4104. These distances may be specified by a perpendicular DSL border to p-active design rule in which case these distances may be equal. Likewise, parallel DSL borders, 4117, 4119, and distances d26 4134, d27 4138, and d28 4136 from p-active areas 4102 and 4104. These distances may be defined by a parallel DSL border to p-active design rule in which case they also may be equal. Parallel DSL border 4121 placement forming space d27 4138 takes precedence over the placement of the perpendicular DSL border forming space d24 4140 because the parallel stress effect in TABLE 3 is more significant than the perpendicular stress effect in TABLE 1.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
 a p-active region of a pmos transistor in an nwell;
 an n-active region of an nmos transistor adjacent to said pmos transistor;
 a perpendicular DSL border where a major portion of said perpendicular DSL border lies within said nwell ; and
 a parallel DSL border between said p-active region and said n-active region where a major portion of said parallel DSL border lies outside said nwell.

2. The integrated circuit of claim 1 where said perpendicular DSL border lies between 75 nm and 300 nm from said p-active region.

3. The integrated circuit of claim 1 where said perpendicular DSL border is about 100 nm from said p-active region.

4. The integrated circuit of claim 1 where a parallel DSL border is greater than about 200 nm from said p-active region.

5. The integrated circuit of claim 1 where said perpendicular DSL border lies approximately half the distance between a border of said nwell and said p-active region.

6. The integrated circuit of claim 1 where said parallel DSL border lies approximately half the distance between a border of said nwell and said n-active region.

* * * * *